United States Patent
Batcheldor et al.

[11] Patent Number: 5,908,661
[45] Date of Patent: Jun. 1, 1999

[54] APPARATUS AND METHOD FOR SPIN COATING SUBSTRATES

[75] Inventors: William T. Batcheldor, Oakland, Calif.; Peter Mahneke, Buchholz, Germany

[73] Assignee: The Fairchild Corporation, Dulles, Va.

[21] Appl. No.: 08/866,832

[22] Filed: May 30, 1997

[51] Int. Cl.$^6$ .............................. B05D 3/12; B05C 11/02
[52] U.S. Cl. ........................... 427/240; 118/52; 427/336; 427/385.5; 437/231
[58] Field of Search ................. 427/240, 385.5, 427/336; 437/231; 118/52

[56] References Cited

U.S. PATENT DOCUMENTS

| | | | |
|---|---|---|---|
| 2,632,725 | 3/1953 | Marks et al. | 154/128 |
| 4,031,852 | 6/1977 | Clarke et al. | 118/52 |
| 4,068,019 | 1/1978 | Boeckl | 427/82 |
| 4,075,974 | 2/1978 | Plows et al. | 118/52 |
| 4,086,870 | 5/1978 | Canavello et al. | 118/52 |
| 4,587,139 | 5/1986 | Hagan et al. | 427/130 |
| 4,775,550 | 10/1988 | Chu et al. | 427/38 |
| 4,838,979 | 6/1989 | Nishida et al. | 156/345 |
| 4,889,069 | 12/1989 | Kawakami | 118/50 |
| 5,003,062 | 3/1991 | Yen | 437/231 |
| 5,013,586 | 5/1991 | Cavazza | 427/240 |
| 5,439,519 | 8/1995 | Sago et al. | 118/52 |
| 5,626,675 | 5/1997 | Sakamoto et al. | 118/663 |
| 5,660,634 | 8/1997 | Fujiyama et al. | 119/319 |
| 5,705,223 | 1/1998 | Bunkofske | 427/240 |

FOREIGN PATENT DOCUMENTS

| | | |
|---|---|---|
| 4203913A1 | 12/1993 | Germany . |
| 60-143871 | 7/1985 | Japan . |
| 62-185321 | 8/1987 | Japan . |

OTHER PUBLICATIONS

Patent Abstracts of Japan, vol. 095, No. 009, Oct. 31, 1995 & JP. 07 142378 A; (Tokyo Electron Ltd; Others: 01), Jun. 2, 1995.
Patent Abstracts of Japan, vol. 013, No. 275 (C–610), Jun. 23, 1989 & JP 01 070168 A (Hitachi Ltd.), Mar. 15, 1989.
Patent Abstracts of Japan, vol. 013, No. 024 (C–561), Jan. 19, 1989 & JP 63 229269 A (Hitachi Ltd.), Sep. 26, 1988.
Patent Abstracts of Japan, vol. 097, No. 002, Feb. 28, 1997 & JP 08 273996 A (NEC Kansai Ltd.), Sep. 18, 1996.
Patent Abstracts of Japan, vol. 097, No. 005, May 30, 1997 & JP 09 0070918 A (M Setetsuku KK), Jan. 10, 1997.

*Primary Examiner*—Janyce Bell
*Attorney, Agent, or Firm*—Martine Penilla & Kim, LLP

[57] ABSTRACT

Disclosed is an apparatus and method for spin coating chemicals over a substrate. The apparatus includes a bowl having a raised support for holding the substrate. The bowl includes curved walls that define a cavity capable of holding a fluid near an outer region of the bowl. The apparatus further includes a lid configured to mate with the curved walls. The lid preferably has a substantially flat underside that is positioned in close proximity to a top surface of the substrate. Further, the apparatus includes fluid injector holes defined along an ejection ring that is defined under the substrate. The fluid injector holes are directed at an underside of the substrate that is near the outer diameter of the substrate. The apparatus also includes a plurality of drain holes that are defined on a floor region of the bowl. The plurality of drain holes are spaced apart from the outer region of the bowl to enable the cavity to hold a fluid while the bowl is spinning, and to drain the fluid when the bowl begins to come to a substantial stop.

27 Claims, 9 Drawing Sheets

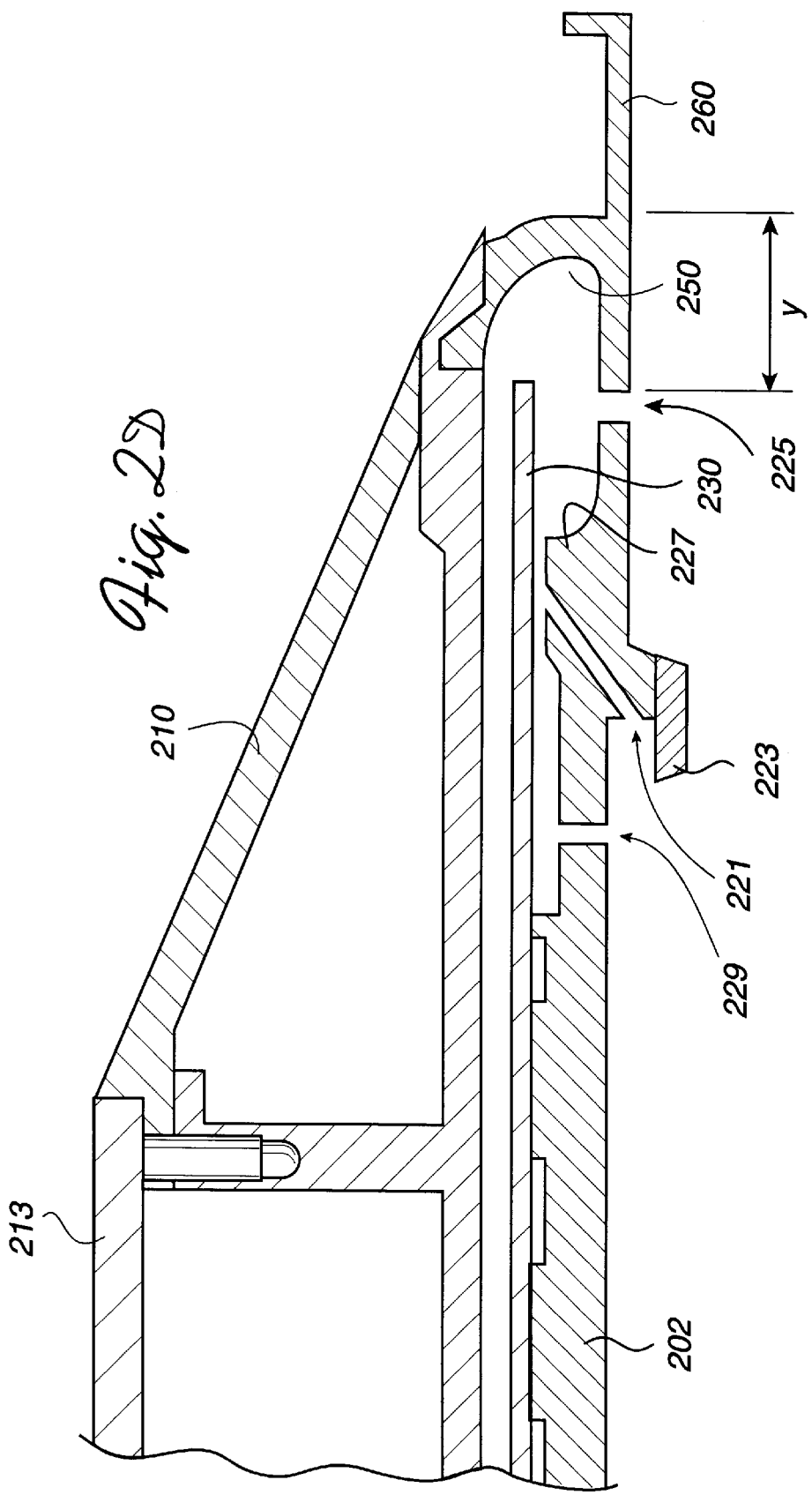

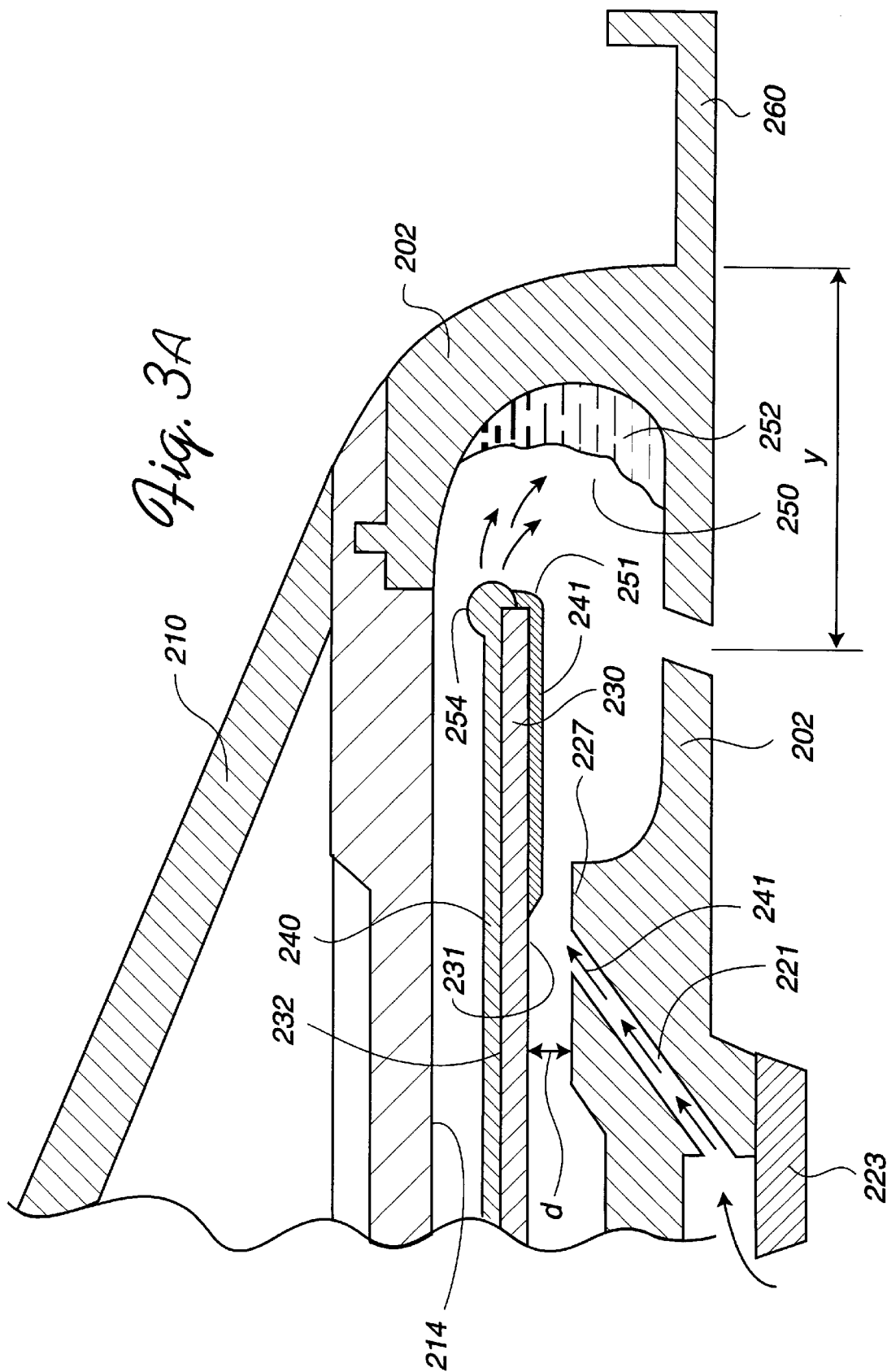

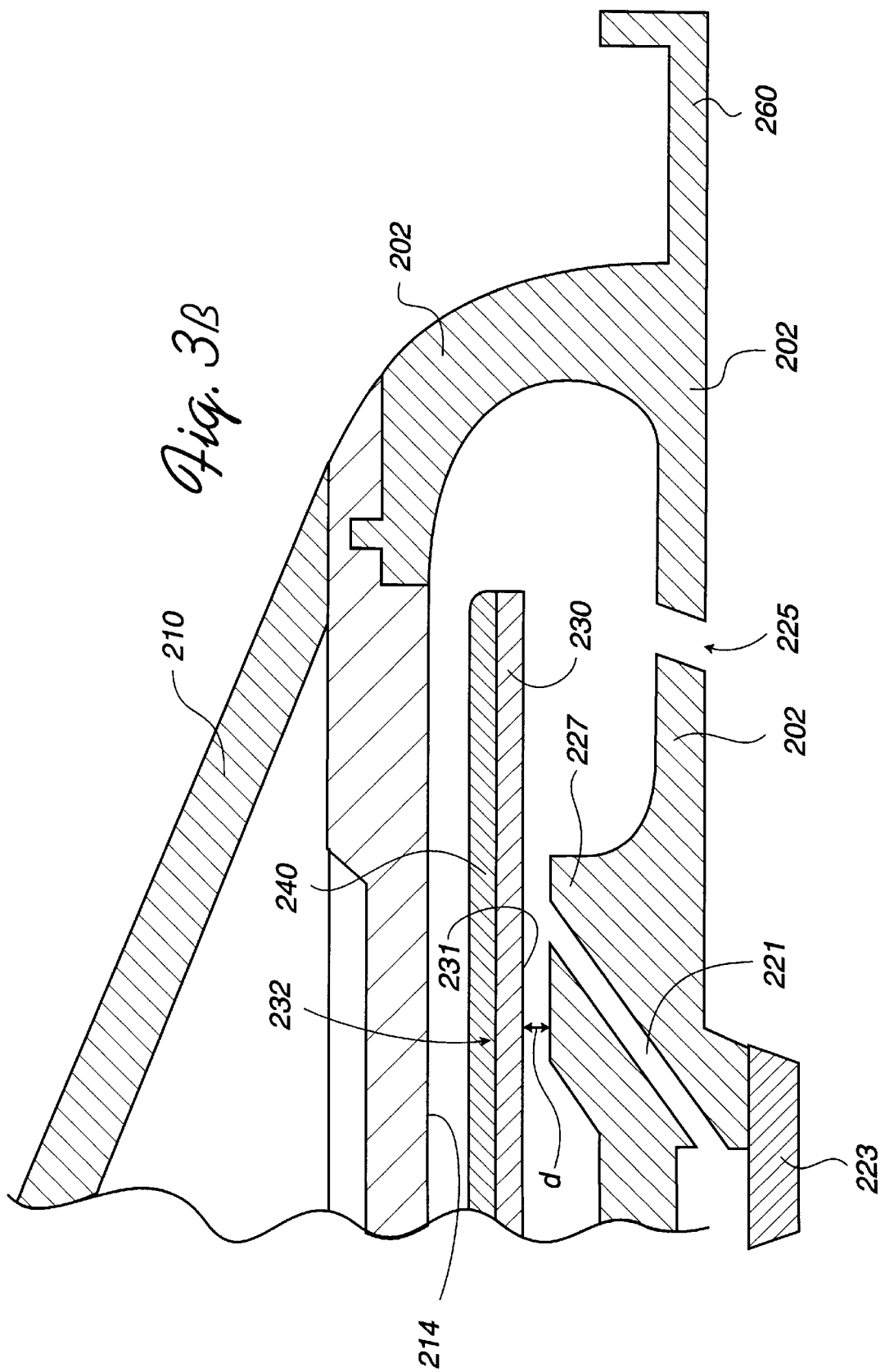

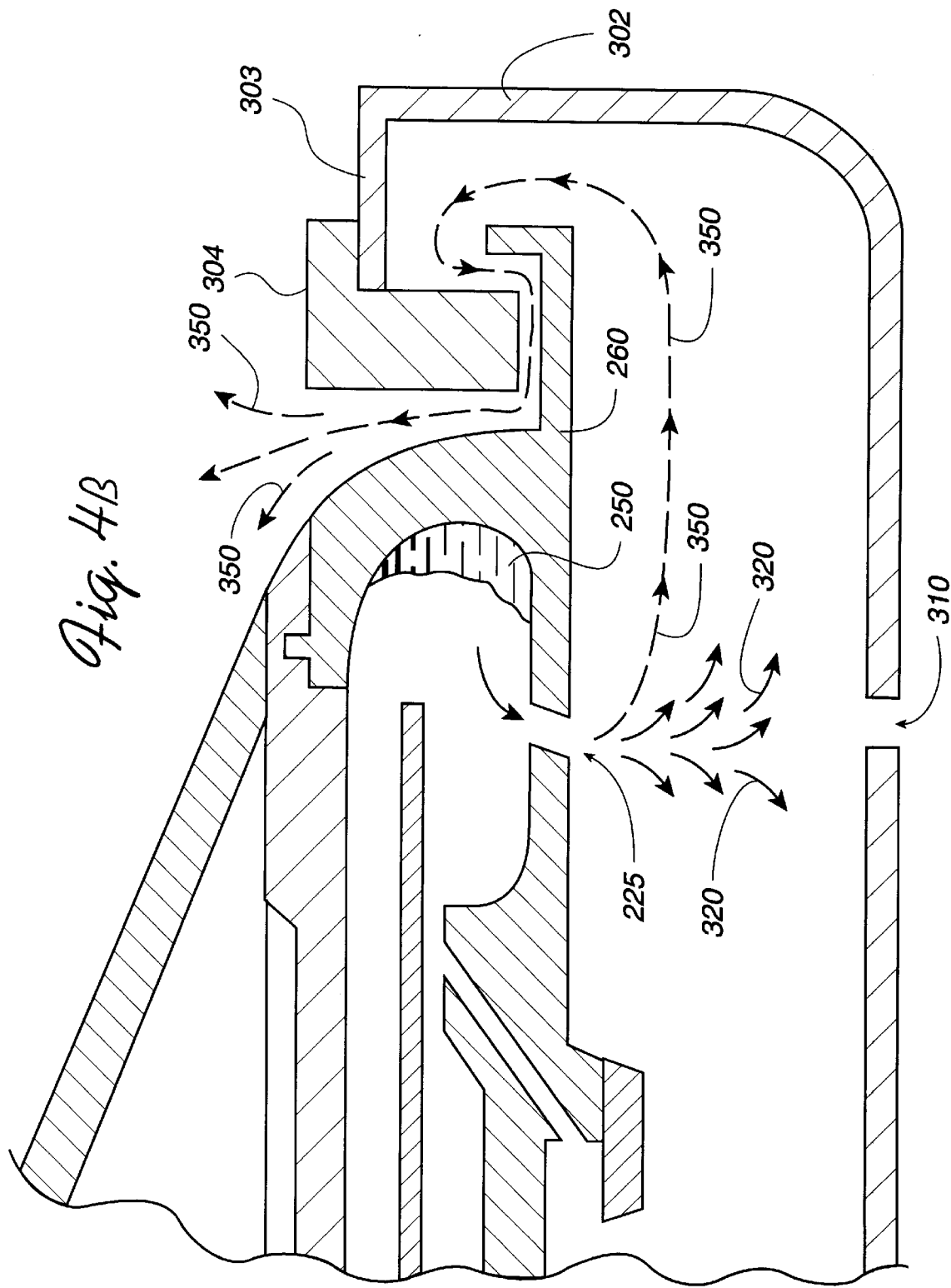

12
APPARATUS AND METHOD FOR SPIN COATING SUBSTRATES

CROSS REFERENCE TO RELATED APPLICATIONS

This application is related to U.S. patent application Ser. No. 08/866,834, filed on the same day as the instant application, and entitled "Spin-Coating Apparatus and Method for Spin-Coating Chemicals." This application is hereby incorporated by reference.

BACKGROUND OF THE INVENTION

1. Field of the Invention

The present invention relates generally to semiconductor fabrication, and more particularly, to apparatuses and methods for spin-coating substrates used in the fabrication of semiconductor devices.

2. Description of the Related Art

The fabrication of a large variety of solid state devices such as semiconductors requires the use of planar substrates, otherwise known to those skilled in the art as wafers. An important consideration in the fabrication of these devices is the final number (i.e., yield) of functional dies remaining from each manufactured wafer. The functional dies are packaged, undergo testing (both electrical and otherwise), and substantially all of the packaged dies that pass the requisite testing are sold. It is therefore of utmost importance for manufacturers of these products to take advantage of economies of scale realized by increasing their production yield. Typically, depending on the individual die dimensions, upwards of 1000 or more dies may be fabricated on a single wafer. These wafers are typically on the order of six to twelve inches in diameter.

A typical fabrication process requires numerous steps, where several layers of material are cumulatively applied and patterned on the surface of the wafer. Once complete, these layers form the desired semiconductor structure necessary for the resulting circuit, or device. As can be appreciated, the final functional yield critically depends upon the proper application of each layer during the various process steps. Proper application of these layers typically depends, in turn, upon the ability to form uniform coatings of material on the surface of the wafer in an efficient, environmentally benign, and production worthy manner.

Various fabrication process steps implemented in making semiconductor devices utilize photolithography to define the desired patterns on the surface of a wafer. As is well known, photolithography is the process where light energy is applied through a reticle mask (using a stepper exposure camara) onto a photoresist material that is applied to the wafer to define patterns where subsequent etching will occur. These surface patterns represent a two dimensional layout of the desired structure that is fabricated on the surface of the wafer. It is therefore important that the photoresist material be applied in uniformly distributed coatings, while at the same time ensuring that particulate generation is minimized. As is well known in the art, when particulate generation is minimized or eliminated, it is possible to increase the resolution of the desired patterns, as well as increase pattern density.

Conventionally, the application of photoresist coatings on the surface of a wafer is accomplished by casting a photoresist fluid on a wafer that is spinning at high speeds within a stationary exhausted bowl. In general, the stationary exhausted bowl is used to catch any excess fluids and remove particulates. Once the photoresist fluid is applied, the centrifugal force that result from the high rotational speed of the wafer overcomes the surface tension of the photoresist fluid, which causes the photoresist fluid to spread over the surface of the wafer.

A side effect of spinning the wafer is the inducement of air flows in the air immediately above and adjacent to the wafer surface. Unfortunately, this air flow tends to induce particles of photoresist to leave the wafer surface at the wafer's edge. When the photoresist leaves the wafer's edge, the free floating photoresist particulates have the potential to back contaminate the remainder of the wafer surface where a fresh coating of photoresist has just been applied. Although these particles may be removed by an exhaust system that may be part of the stationary bowl, the exhaust has the undesirable effect of drying out photoresist solvent films unevenly and, thus, producing a non-uniform coating of photoresist over the surface of the wafer during the spinning process. Back side contamination of the photoresist film with photoresist particulates and uneven drying of the photoresist film are therefore, undesirable yield reducing side effects of conventional spin-coating processes.

Another problem associated with conventional spin coating methods is photoresist fluid beading at the outer edge of the spinning wafer. Specifically, it is believed that surface tension and adhesion of the photoresist film to the wafer surface experienced during spinning causes the photoresist to from a "zone of increased thickness" at the edge of the wafer. This beading can typically contribute to a significant loss in functional devices that lie at and near the outer edge of the wafer.

Yet another problem associated with the beading effect at the edges of the wafers is that wafers are commonly stored in cassettes and, the increased thickness at the edges has the unfortunate effect of fracturing the wafers when they come in contact with the storage cassette. Of course, when wafers are fractured in any way, an instant loss in yield is experienced.

FIG. 1 is an illustration of a conventional open bowl apparatus 110 for spin coating a wafer 116. A wafer 116 is typically placed upon a rotatable chuck 114 which is rigidly connected to a spinning motor unit 120 by a shaft 18. As shown, the spinning chuck 114 and the wafer 116 are located within an open stationary bowl 112. The open stationary bowl 112 may include suitable exhaust passages 122 that are used to purge out particulates that may be produced within open stationary bowl 112 during a spin coating process. Unfortunately, conventional methods for removing particulates produced during spin coating operations have been less than adequate.

During a spin coating operation, a number of air flows 117 may be produced in the air immediately above and adjacent to the spinning chuck 116. As described above, the air flows 117 tend to produce particles of photoresist that further complicate the back contamination problems described above.

In view of the foregoing, there is a need for apparatuses and methods that facilitate the application of substantially uniform spin coated materials over the surface of a wafer while reducing the amount of yield reducing particulates.

SUMMARY OF THE INVENTION

Broadly speaking, the present invention fills these needs by providing methods and apparatuses for uniformly spin-coating materials over the surface of wafers. It should be appreciated that the present invention can be implemented in numerous ways, including as a process, an apparatus, a system, a device, or a method. Several inventive embodiments of the present invention are described below.

In one embodiment, an apparatus for spin coating chemicals over a substrate is disclosed. The apparatus includes a bowl having a raised support for holding the substrate. The bowl includes curved walls that define a cavity capable of holding a fluid near an outer region of the bowl. The apparatus further includes a lid configured to mate with the curved walls. The lid preferably has a substantially flat underside that is positioned in close proximity to a top surface of the substrate. Further, the apparatus includes fluid injector holes defined along an ejection ring that is defined under the substrate. The fluid injector holes are directed at an underside of the substrate that is near the outer diameter of the substrate. The apparatus also includes a plurality of drain holes that are defined on a floor region of the bowl. The plurality of drain holes are spaced apart from the outer region of the bowl to enable the cavity to hold a fluid while the bowl is spinning, and to drain the fluid when the bowl begins to come to a substantial stop.

In another embodiment, a method for spin coating a substrate is disclosed. The method includes applying a chemical to be spin coated over a substrate that is supported within a bowl. The bowl has a fluid retaining cavity at an outer edge of the bowl. The method further includes encapsulating the substrate in the bowl, and spinning the encapsulated bowl to cause the applied chemical to be spin coated over the surface of the wafer. Further, the method includes injecting a solvent to an underside edge of the wafer to remove an excess chemical beading from the edge of the wafer, and collecting the solvent and the excess chemical beading that flows off of the substrate in the fluid retaining cavity while the encapsulated bowl is spinning. Further, the method includes draining the excess chemical beading and the solvent that is collected in the fluid retaining cavity when the encapsulated bowl nears a non-spinning state.

Advantageously, the apparatus lid is configured to enclose the wafer and seal out the environment above the wafer surface during a spin coating process. The plurality of injection holes defined in the floor of the spinning bowl are well suited for applying a solvent to the underside of the wafer to rinse the edge of the wafer to prevent edge beading of the applied chemicals (e.g., photoresist, SOG, and other spun on dielectrics). Generally, the solvent that is applied to the underside of the wafer is driven into the spinning bowl by the centrifugal forces produced when the bowl is spinning. Accordingly, the applied solvent may also be used to clean the inside of the bowl after each spin coating operation to reduce chemical build up, which may cause yield reducing defects.

Furthermore, the fluid retaining cavity in the bowl is well suited to hold any excess chemicals that are spin coated over the wafer as well as any solvent material that may be applied to the underside of the wafer. Preferably, substantially all fluids are retained within the cavity while the bowl is spinning, and when the bowl comes to a stop, the fluids may drain out through drain holes defined in the floor of the bowl. As an advantage, by capturing the fluids within the cavity during a spin coating operation, substantially less yield reducing particulates are produced. In a further embodiment, an extension of the bowl is well suited to form a labyrinth with a splash ring of a catch cup, and thereby substantially further reduce the possibility of air borne particulates outside to the bowl/catch cup system. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings:

FIG. 2D is an enlarged side view the rotatable bowl of FIG. 2B illustrating a cavity for holding fluids during a wafer spin coating operation in accordance with one embodiment of the present invention.

FIG. 3A is a cross sectional view of the applied coating fluid captured in the cavity during the spin coating operation in according with one embodiment of the present invention.

FIG. 3B is a cross sectional view of the applied coating after a solvent back rinse operation is performed in accordance with one embodiment of the present invention.

FIG. 4B is a magnified cross sectional view of a labyrinth formed by an extension of the rotatable bowl and a splash ring of the catch cup of FIG. 4A in accordance with one embodiment of the present invention.

DETAILED DESCRIPTION OF THE PREFERRED EMBODIMENTS

Figure 1:
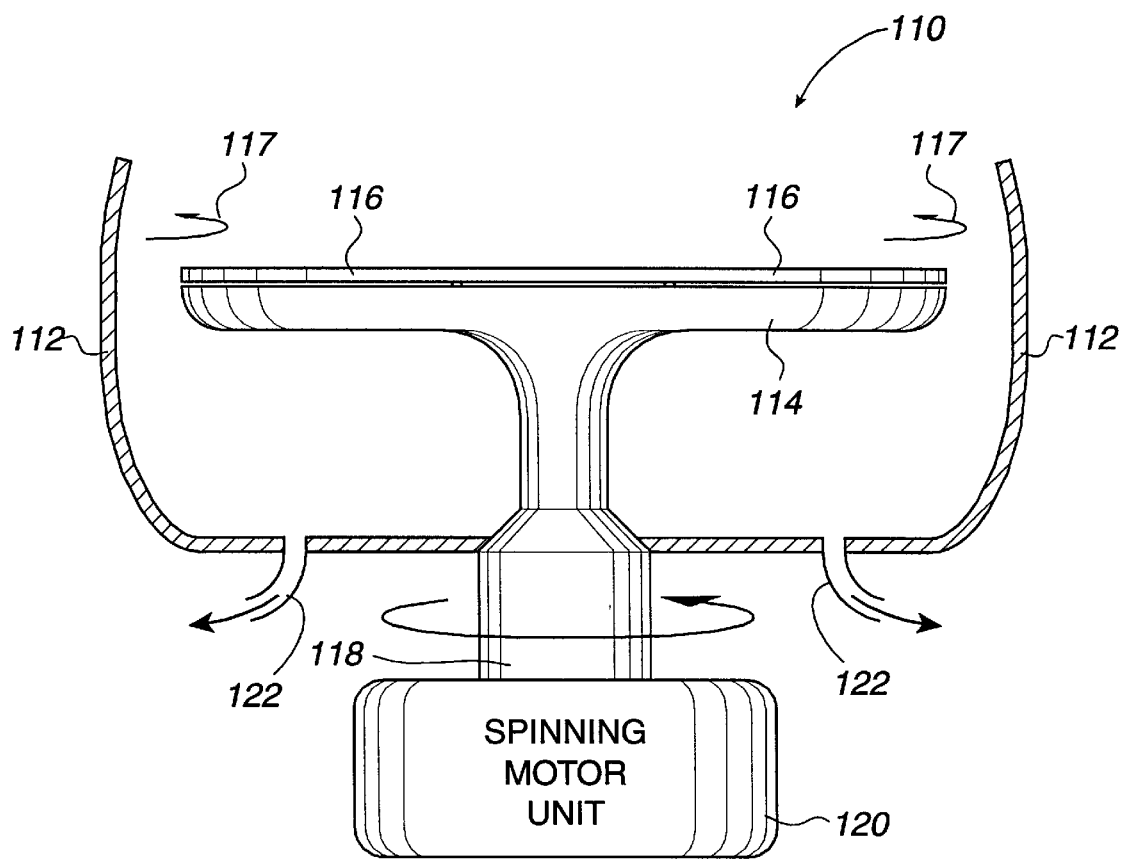
FIG. 1 is a cross-sectional view of a substrate spin coated in a conventional open bowl arrangement.

An invention for a closed semiconductor process bowl that reduces particulate generation and provides improved spin coat uniformities is disclosed. Although the present invention is particularly well suited for the application of photoresist materials, other chemicals, such as, spin-on-glass (SOG) and spin-on-dielectrics (SODs) may also find the application processes described herein particularly advantageous for achieving improved coating uniformities and reducing particulates. Furthermore, the various embodiments of the present invention may be implemented in any form, and may find particular use in the application of both high viscosity and lower viscosity materials. In the following description, numerous specific details are set forth in order to provide a thorough understanding of the present invention. It will be obvious, however, to one skilled in the art, that the present invention may be practiced without some or all of these specific details. In other instances, well known process operations have not been described in detail in order not to unnecessarily obscure the present invention.

In accordance with one embodiment, a closed process bowl is disclosed where chemicals are spin coated over a substrate during a fabrication process. In a preferred embodiment, the substrate is a wafer that may be used to make semiconductor devices. Generally, the wafer is placed on a rotatable bowl that is rigidly affixed to a motor driven shaft. During the coating process, a chemical such as photoresist is applied to the surface of the wafer before a lid is secured to the rotatable bowl having curved walls. The spinning of the bowl causes the chemical to spread over the surface of the wafer. To combat the aforementioned edge beading problems, a solvent is preferably injected on the backside (i.e., back side rinse) of the spinning wafer near its outer diameter after the photoresist has spread over the surface of the wafer. Preferably, the solvent is injected through a plurality of solvent injector holes that extend from an outer surface of the rotatable bowl to an interior region of the rotatable bowl. When applied, the solvent is forced into the rotatable bowl by the centrifugal force produced by the spinning action. In one embodiment, the applied solvent acts to substantially reduce beading at the outer regions of the wafer. Further, the applied solvent also acts to reduce contamination at the under surface of the wafer.

Any dissolved coating material and excess solvent is preferably captured in a concave region located at an interior edge of the bowl while the spin coating process is in progress. Once spin coating is complete (e.g., the spinning bowl comes to a substantial halt), the captive dissolved coating material and excess solvent are allowed to flow out of the spinning bowl through drain holes that are located on the lower surface of the bowl. That is, while the bowl is spinning, the centrifugal force acts to holds the dissolved coating material in the concave region. However, once the centrifugal forces diminish, the liquid will be allowed to flow out of the closed bowl system. It should be appreciated that substantially all particulates are advantageously contained within the closed bowl system during the spin coat operation, thereby reducing backside contamination problems as well as environmental contamination.

In accordance with a further embodiment of the present invention, the back side and sometimes top side edge bead removal (EBR) process steps enable the generation of substantially uniform coatings within a controlled environment that reduces particulate generation. Furthermore, the EBR process steps advantageously assist in automatically rinsing the bowl after each coating operation. Of course, maintaining the bowl clean during a spin coating session is particularly important to reduce the possibility of contaminating current wafers with particulates of previous spin coating sessions.

Figure 2A:
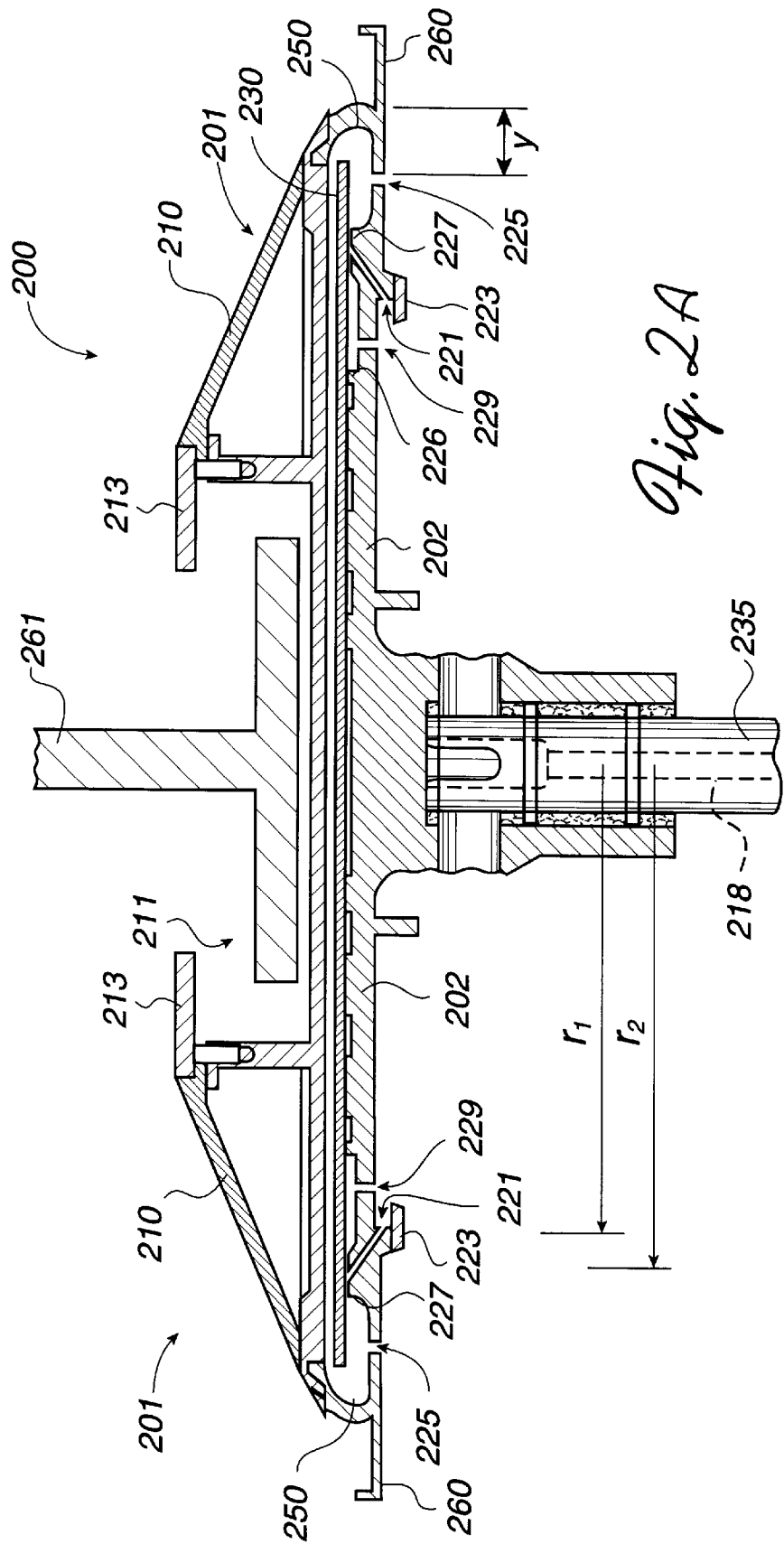
FIG. 2A is an exploded view of a rotatable bowl and a lid in accordance with one embodiment of the present invention.
Figure 2B:
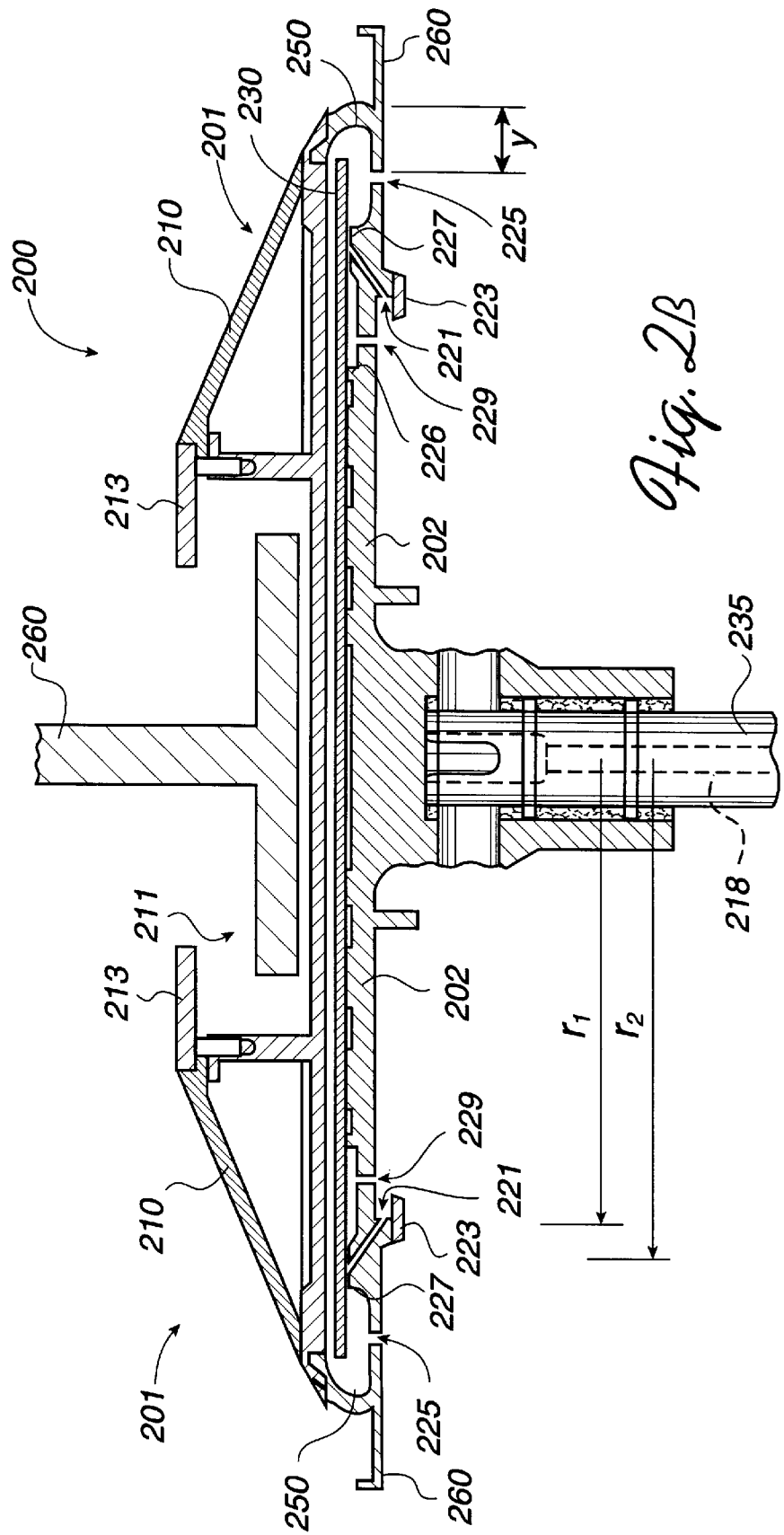
FIG. 2B is a side cross sectional view of the rotatable bowl of FIG. 2A in accordance with one embodiment of the present invention.

FIG. 2A is an exploded view of a closed semiconductor process bowl 200 including a bowl 202 and a lid 201, and FIG. 2B is an assembled view in accordance with one embodiment of the present invention. In this embodiment, the lid 201 preferably has a circular shape with an upper beveled surface 210, a lower flat surface 214, and a hollow internal region 211 that is accessible through a top opening 213. Preferably, the bowl 202 is integrally connected to a motor driven axial shaft 235 that includes an axially located vacuum chamber 218 extending along the length of the axial shaft 235 and terminating in a vacuum orifice 219. Vacuum orifice 219 is preferably centrally located within bowl 202 for securing wafers to a support surface 204.

As shown in FIG. 2B, support surface 204 of bowl 202 is well suited to hold a wafer 230 during spin coating operations. In a preferred embodiment, the substrate is a silicon wafer used in the fabrication of semiconductor integrated circuits. However, it should be appreciated that the various embodiments of the present invention may be equally applicable to other technologies where precision chemical (i.e., photoresist, spin-on-glass (SOG), spin-on-dielectrics (SODs), compact disc recordable (CDR) dye chemicals, mask plates, liquid crystal display panels, multi-chip carriers, etc.) spin-coating is desirable. In this embodiment, a support ring 226 defines the outer diameter of support surface 204. In this example, lid 201 will preferably have a circular recessed groove 212 defined in the lower flat surface 214. Circular recessed groove 212 is preferably configured to mate with a circular protruded lip 224 that is located around the outer portion of bowl 202. Further, a separation of between about 1 mm and about 10 mm is preferably defined between the lower flat surface 214 of lid 201 and the top surface of wafer 230, and more preferably, the separation is between about 1.5 mm and about 3, and most preferably about 2.

As mentioned above, bowl 202 preferably includes a cavity 250 for holding any dissolved coating material and excess solvent during the spin coating process. Therefore, while bowl 202 and lid 201 are spinning, the centrifugal forces will hold the excess liquid in cavity 250, and when the forces diminish, the liquid will preferably flow out through a plurality of drain holes 225. Preferably, between about 8 and about 16 drain holes 225 are defined along the floor of bowl 202 to enable the applied chemicals to exit after a spin coating application.

Referring to FIG. 2B, bowl 202 also includes a plurality of solvent injection holes 221 that have a first end located within a solvent injector ring 223 (at a radial distance r, from the center of bowl 202), and a second end located approximately at the mid-line of a solvent ejector ring 227 (at a radial distance $r_2$ from the center of bowl 202). Generally, radial distance $r_1$ is less than radial distance $r_2$, therefore solvent injection hole 221 forms an angled conduit (e.g., between about a 30 and 50 degrees) through bowl 202 connecting solvent injector ring 223 and solvent ejector ring 227.

Bowl 202 also includes a circular extension 260 that extends from the outer region of bowl 202 to reduce the possibility of particulate contamination. As will be described in greater detail below with reference to FIG. 4B, circular extension 260 forms a labyrinth with a stationary catch cup splash ring to prevent substantially all generated particulates from exiting the system and contaminating the spin coated chemicals.

To ensure that lid 201 remains secured to bowl 202, a locking shaft 261 is placed near the lower surface 214 of lid 201. By way of example, locking shaft 261 conforms to the shape of the top opening 213 of lid 201, thereby accessing hollow internal region 211. Once inserted into hollow internal region 211, locking shaft 261 is rotated approximately 120° in either direction. In this manner, locking shaft 261 is firmly affixed near the lower surface 214 of lid 201 to ensure that lid 201 does not detach during a spin coating process.

Figure 2C:
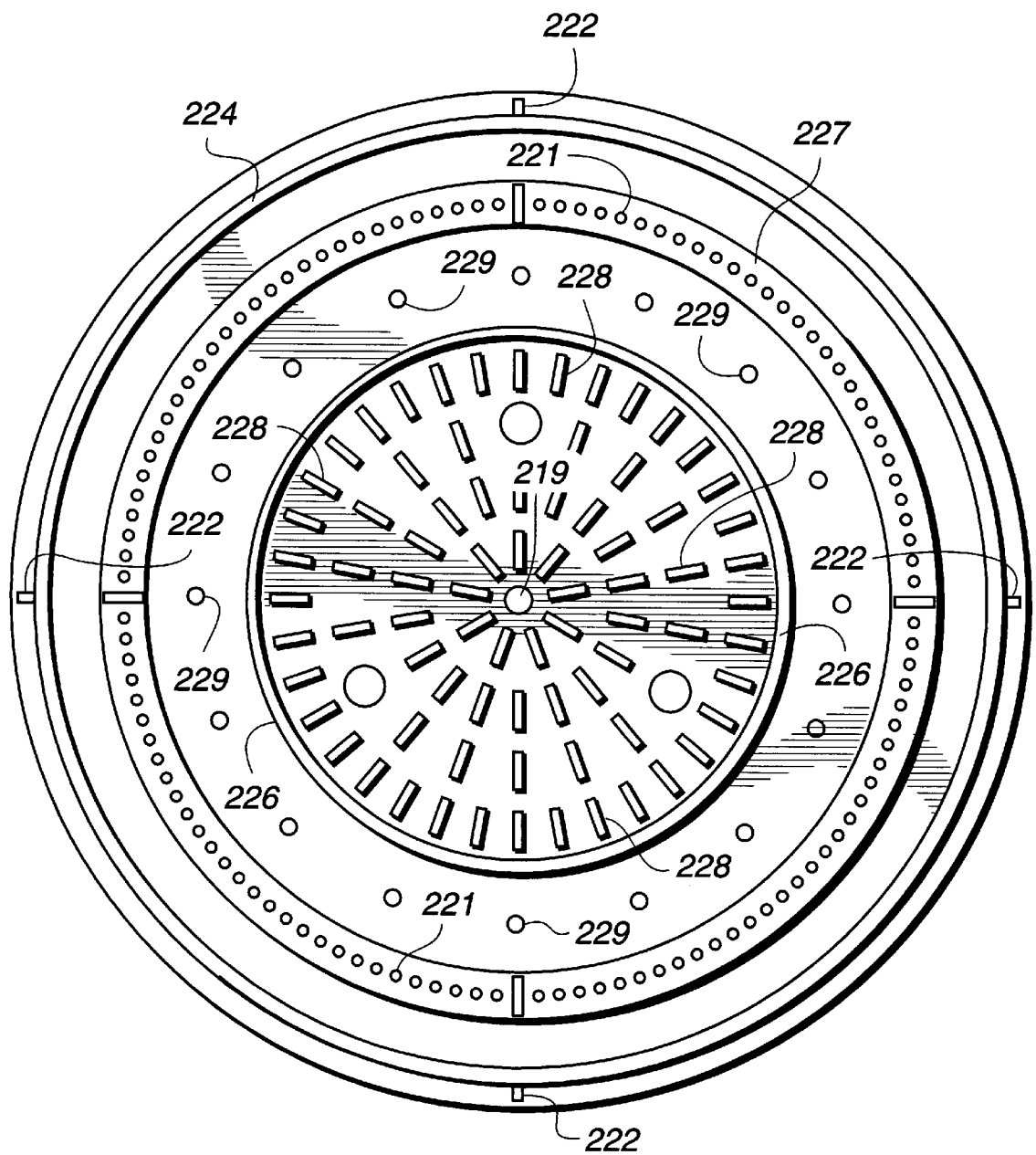
FIG. 2C is a top view of a rotatable bowl in accordance with one embodiment of the present invention.

Additionally, a plurality of locking pins 222 shown in FIGS. 2A and 2C are arranged about the top portion of the walls of bowl 202 to assist in securing lid 201 during processing. Generally, locking pins 222 are configured to mate with suitable recessed pin holes located on the underside of lid 201. In another embodiment, lid 201 may include magnetic latches (not shown) for securing lid 201 to bowl 202. Generally, the magnetic latches may be composed of a plurality of attracting magnet pads that are well balanced along the top portion of the walls of bowl 202 and along the underside of the lid 201. In this manner, the magnet pads of the bowl 202 and the lid 201 are not required to mate in the same fixed orientation each time the lid 201 is applied to the bowl 202. As an advantage, a more rapid sealing of bowl 202 may be performed which, in some cases, may prevent premature drying of the chemicals that applied to the wafer 230.

FIG. 2C is a top view of bowl 202 in accordance with one embodiment of the present invention. From this perspective, the drain holes 229 are shown between support ring 226 that defines the outer diameter of support surface 204 and a solvent ejector ring 227. Drain holes 229 are especially well suited to drain out any chemicals that may seep towards support ring 226. Although the plurality of solvent injection holes 221 that are defined in solvent ejector ring 227 are preferably configured to apply chemicals towards the outer edge of a wafer (i.e., away from support ring 226), some chemicals may get caught in between support ring 226 and solvent ejector ring 227. Accordingly, drain holes 229 allow any chemicals trapped in this area to easily flow out. In this embodiment, support surface 204 also includes a plurality of supports 228 that extend radially outward from the centrally located vacuum orifice 219 to the support ring 226.

FIG. 2D is a magnified cross sectional view of FIG. 2B having the plurality of drain holes 225 spaced a distance "y" from the outer edge of bowl 202 (excluding circular extension 260). In this manner, the plurality of drain holes 225 (being between about 1 and 3 mm in diameter) lie under wafer 230 to ensure that cavity 250 will hold the excess solvent and dissolved photoresist during a spin coating operation. For this reason, cavity 250 is preferably large enough to accommodate a volume of between about 10 cubic centimeters and about 20 cubic centimeters.

FIG. 3A is a more magnified view of cavity 250 holding solvent fluids provided through solvent injection holes 221 and dissolved chemicals that spread off of the wafer 230 in accordance with one embodiment of the present invention. As described above, while bowl 202 is spinning during a spin coating process, the centrifugal force will ensure that the excess chemicals will be contained in cavity 250 during the spin coating process. Therefore, when a chemical, such as, photoresist is applied over a top surface 232 of wafer 230, a photoresist beading 254 will unfortunately occur at the edge of wafer 230.

To eliminate beading 254, a solvent 241 is applied from under bowl 202 against injection ring 223, through injection holes 221, and onto the back side of wafer 230. Once the solvent 241 is applied to an under surface 231 of wafer 230, the solvent material spreads in an outward manner due to the centrifugal forces of the spinning motion of bowl 202. When the solvent 241 reaches the edge of wafer 230, the solvent bead 251 is believed to interact with a beading 254 of a chemical coating 240. When solvent 241 comes in contact with beading 254, the beading 254 will begin to dissolve and fall into cavity 250. As an advantage, substantially all of the excess fluids are captured in cavity 250 during a spin coating operation, and substantially all uncontrolled solvents and coating chemicals are prevented from exiting bowl 202 where undesirable particulates may be generated.

FIG. 3B is a cross sectional view of the chemical coating 240 applied in a substantially uniform manner to the entire top surface of wafer 230 in accordance with one embodiment of the present invention. As described above, bowl 202 having cavity 250 advantageously reduces the amount of produced particulates during a spin coating operation. Further, the closed bowl configuration assists in maintaining coating uniformities by preventing the premature drying of the applied solvents. As a result, chemical coating 240 may be applied more evenly, while substantially preventing the yield reducing defects associated with beading and premature solvent drying.

Figure 4A:
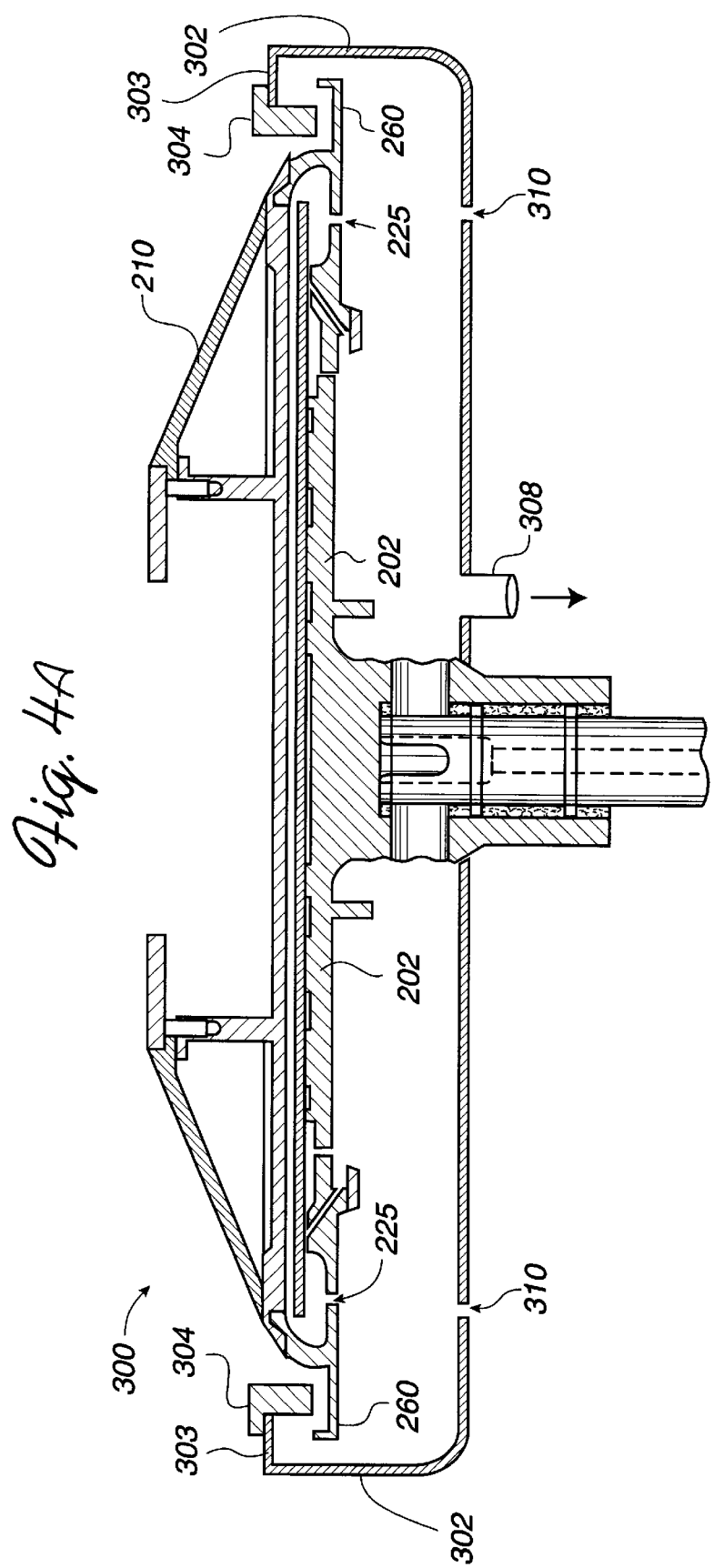
FIG. 4A is an exemplary spin coating system including a catch cup and splash rings in accordance with one embodiment of the present invention.

FIG. 4A illustrates an exemplary spin coating system 300 that may be used to reduce particulate generation in accordance with one embodiment of the present invention. As shown, bowl 202 and lid 201 are partially contained within a catch cup 302 that includes a first splash ring 303 and a second splash ring 304. Catch cup 302 also includes exemplary floor drain holes 310 that drain chemicals that flow out of drain holes 225, and then removed to a drain manifold. An exhaust manifold 308 may also be used to assist in the removal of air borne particulates. Of course, any number of well known exhaust manifolds 308 may be implemented as well. In this embodiment, the second splash ring 304 is preferably well suited to meet circular extension 260 and form a labyrinth to substantially prevent the escape of air borne particulates into the environment surrounding the spin coating system 300.

FIG. 4B is an exploded view of the exemplary spin coating system 300 illustrating the labyrinth in accordance with one embodiment of the present invention. As shown, when chemicals are being spin coated over the wafer, some chemicals may fly out of cavity 250 through the drain holes 225, causing particulates 320 to spread into catch cup 302. However, the particulates 320 that are contained within catch cup 302 are typically not a problem because they are removed by exhaust manifold 308. Because the second splash ring 304 is designed to almost contact the circular extension 260 of bowl 202, for particulates to escape, the particulates would have to traverse an unlikely path 350 before exiting the spin coating system 300.

As a result of the labyrinth created between bowl 202 and second splash ring 304, as well as the fluid capturing cavity 250, the amount of yield reducing particulates are substantially eliminated. Therefore, the closed bowl spin coating system 300 provides wafer manufactures with a powerful tool for increasing yields and maintaining substantially particulate free uniform chemical coatings.

Although the foregoing invention has been described in some detail for purposes of clarity of understanding, it will be apparent that certain changes and modifications may be practiced within the scope of the appended claims. By way of example, the methodology described herein may also be used to provide superior coating uniformities for square substrates, such as, mask plates, liquid crystal display panels and multi-chip carrier modules. Accordingly, the present embodiments are to be considered as illustrative and not restrictive, and the invention is not to be limited to the details given herein, but may be modified within the scope and equivalents of the appended claims.

What is claimed is:

1. An apparatus for spin coating chemicals over a substrate, comprising:

a bowl having a raised support for holding the substrate, the bowl having curved walls that define a cavity capable of holding a fluid near an outer region of the bowl;

a lid configured to mate with the curved walls, the lid having a substantially flat underside that is positioned in close proximity ranging between about 1 mm and about 10 mm to a top surface of the substrate;

fluid injector holes defined along an ejection ring that is under the substrate, the fluid injector holes being directed at an underside of the substrate that is near the outer diameter of the substrate, and a plurality of drain holes defined on a floor region of the bowl, the plurality of drain holes being spaced apart from the outer region of the bowl to enable the cavity to hold a fluid while the bowl is spinning at a high rate, and drain the fluid when the bowl slows down.

2. An apparatus for spin coating chemicals over a substrate as recited in claim 1, wherein the fluid that is applied to the substrate is caused to spread over the substrate by a centrifugal force when the bowl is spinning, the centrifugal force further acting to hold the fluid that spreads off of the substrate in the cavity while the bowl is spinning.

3. An apparatus for spin coating chemicals over a substrate as recited in claim 2, wherein the fluid injector holes are defined at an angle ranging between about 30 degrees and about 50 degrees.

4. An apparatus for spin coating chemicals over a substrate as recited in claim 3, wherein the substantially flat underside of the lid is between about 2 mm and about 3 mm separated from a top surface of the substrate.

5. An apparatus for spin coating chemicals over a substrate as recited in claim 4, further including an injector ring that is defined on an under surface of the bowl for channeling a solvent through the fluid injector holes.

6. An apparatus for spin coating chemicals over a substrate as recited in claim 5, wherein the fluid applied to the substrate is a chemical selected from the group consisting of a photoresist chemical and a spin-on-glass chemical.

7. An apparatus for spin coating chemicals over a substrate as recited in claim 5, wherein the solvent is applied to the underside of the substrate that is near the outer diameter of the substrate, the solvent being configured to remove a beading of the chemical at an edge of the substrate.

8. An apparatus for spin coating chemicals over a substrate as recited in claim 7, wherein the applied solvent and applied chemical is captured in the cavity by the centrifugal force when the bowl is spinning.

9. An apparatus for spin coating chemicals over a substrate as recited in claim 8, further comprising a locking shaft for mechanically applying the lid over the bowl, and the locking shaft being configured to secure the lid when the bowl is spinning.

10. An apparatus for spin coating chemicals over a substrate as recited in claim 8, wherein the bowl includes a plurality of magnetic pads for securing the lid to the bowl.

11. An apparatus for spin coating chemicals over a substrate as recited in claim 8, wherein the cavity is configured to hold a volume of between about 10 cubic centimeters and about 20 cubic centimeters.

12. An apparatus for spin coating chemicals over a substrate as recited in claim 1, wherein the bowl includes an extension defined outwardly from an outer edge of the curved walls.

13. An apparatus for spin coating chemicals over a substrate as recited in claim 1, further comprising a catch cup configured to receive the bowl having the extension defined outwardly from an outer edge of the curved walls, the catch cup further including at least one splash ring that that defines a particulate reducing labyrinth with the extension.

14. A method for spin coating a substrate, comprising:
applying a chemical to be spin coated over a substrate that is supported within a bowl, the bowl having a fluid retaining cavity at an outer edge of the bowl;
encapsulating the substrate in the bowl;
spinning the encapsulated bowl to cause the applied chemical to be spin coated over the surface of the wafer;
injecting a solvent in a vicinity of an underside edge of the wafer to remove an excess chemical beading from the edge of the wafer; and
collecting the solvent and the excess chemical beading that flows off of the substrate in the fluid retaining cavity while the encapsulated bowl is spinning.

15. A method for spin coating a substrate as recited in claim 14, further comprising:
draining the excess chemical beading and the solvent that is collected in the fluid retaining cavity when the encapsulated bowl nears a non-spinning state.

16. A method for spin coating a substrate as recited in claim 15, wherein the excess chemicals collected in the fluid retaining cavity are drained through a plurality of drain holes defined in a base region of the bowl.

17. A method for spin coating a substrate as recited in claim 16, wherein the plurality of drain holes are spaced apart from the outer perimeter of the bowl to establish the fluid retaining cavity.

18. A method for spin coating a substrate as recited in claim 15, wherein the fluid retaining cavity is configured to hold a volume of between about 10 cubic centimeters and about 20 cubic centimeters.

19. A method for spin coating a substrate as recited in claim 15, further comprising:
retarding chemical evaporation of the applied chemical when the bowl is encapsulated during the spinning, the retarded chemical evaporation being configured to result in a more uniform spin coating on a top surface of the substrate.

20. A method for spin coating a substrate as recited in claim 15, further comprising:
providing a bowl extension along an outer edge of the bowl.

21. A method for spin coating a substrate as recited in claim 20, further comprising:
providing a catch cup for holding the encapsulated bowl during the spinning, the catch cup having at least one splash ring;
forming a labyrinth between the at least one splash ring and the bowl extension, the labyrinth being configured to reduce the amount of particulates that escape the catch cup.

22. A method for spin coating a substrate as recited in claim 20, further comprising:
cleaning the bowl of excess chemicals after each spin coating operation with the solvent that is injected into the bowl.

23. A spin coating device, comprising:
means for applying a chemical to be spin coated over a substrate that is supported within a bowl, the bowl having a fluid retaining cavity at an outer edge of the bowl;
encapsulating means to contain the substrate in the bowl;
means for spinning the encapsulated bowl to cause the applied chemical to be spin coated over the surface of the wafer;
injector means to apply a solvent to an underside edge of the wafer, the solvent application being configured to remove an excess chemical beading from the edge of the wafer; and
means for collecting the solvent and the excess chemical beading that flows off of the substrate in the fluid retaining cavity while the encapsulated bowl is spinning.

24. A spin coating device as recited in claim 23, further comprising:
drain means for removing the excess chemical beading and the solvent that is collected in the fluid retaining cavity from the bowl when the bowl comes to a substantial stop.

25. A spin coating device as recited in claim 24, further comprising:

means for cleaning an interior of the bowl after each substrate is spin coated.

26. A spin coating device as recited in claim 24, further including a labyrinth defined between the bowl and a catch cup splash ring, the labyrinth being configured to substantially prevent particulates from exiting the catch cup during a spin coating operation.

27. A spin coating device as recited in claim 26, wherein the chemical is selected from the group consisting of a photoresist chemical and a spin-on-glass chemical.

* * * * *